United States Patent [19]

Yamada et al.

[11] Patent Number: 4,933,715
[45] Date of Patent: Jun. 12, 1990

[54] METHOD OF DETECTING POSITION OF A MARK

[75] Inventors: Yuichi Yamada, Kawasaki; Naoki Ayata; Machida; Hiroki Suzukawa, Yokohama; Hideki Nogawa, Ohizumimachi, all of Japan

[73] Assignee: Canon Kabushiki Kaisha, Tokyo, Japan

[21] Appl. No.: 301,366

[22] Filed: Jan. 25, 1989

[30] Foreign Application Priority Data

Jan. 27, 1988 [JP] Japan ................................ 63-14527

[51] Int. Cl.$^5$ ............................................ G03B 27/42
[52] U.S. Cl. ......................................... 355/53; 355/77
[58] Field of Search ...................... 355/53, 54, 77, 75

[56] References Cited

U.S. PATENT DOCUMENTS

| | | | |
|---|---|---|---|
| 4,704,020 | 11/1987 | Murakami et al. | 355/53 |
| 4,704,027 | 11/1987 | Phillips | 355/53 |
| 4,711,567 | 12/1987 | Tanimoto | 355/53 |
| 4,814,829 | 3/1989 | Kosugi et al. | 355/53 |

Primary Examiner—Monroe H. Hayes
Attorney, Agent, or Firm—Fitzpatrick, Cella, Harper & Scinto

[57] ABSTRACT

A mark detecting method and device suitably applicable to the alignment of a reticle in a semiconductor device manufacturing exposure apparatus, called a stepper, is disclosed. A mark is provided by repeated patterns having specific pitches. These patterns are set so that at least one pitch of the patterns differs, on a light-receiving surface of an image sensor which receives an image of the mark, from a multiple, by an integral number, of the sampling pitch (pitch of picture elements) of the image sensor. In one preferred form, the mark is formed by repeated patterns of a number N ($\geq 2$), wherein at least one pitch Pp of the patterns satisfies, on the light-receiving surface of the image sensor, a relationship $Pp = (m + n/N) \times Pix$ where m is an arbitrary number, n is an integral number which satisfies $1 \leq n \leq N$, and Pix is the sampling pitch of the image sensor. The image of such a mark is photoelectrically converted to thereby determine the position of the mark. With the proposed concept, any error which might be caused upon quantization of the mark image by the picture elements of the image sensor can be canceled or compensated at the time of calculation of the mark center. Therefore, the precision of the mark center detection can be improved.

8 Claims, 3 Drawing Sheets

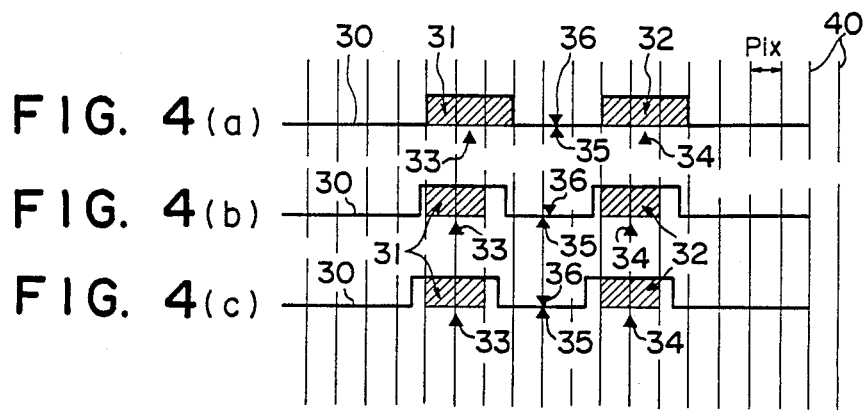
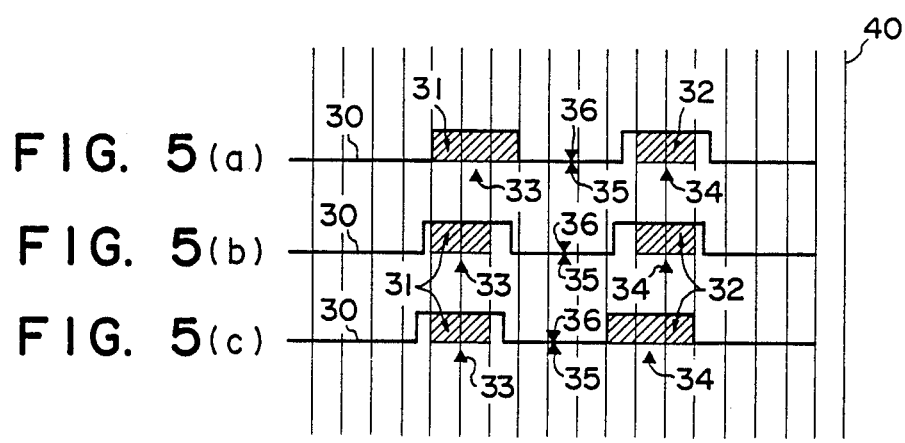

METHOD OF DETECTING POSITION OF A MARK

FIELD OF THE INVENTION AND RELATED ART

This invention relates to a mark detecting method and, more particularly, to a method of detecting the position of a mark, suitably usable, for example, in a process of manufacture of high-density integrated circuit chips such as semiconductor memories or computing devices, particularly for the detection of the position of a reticle or wafer in the pattern printing process.

Proposals have been made for such a device and method wherein, for detection of the position of a reticle or a wafer in a semiconductor device manufacturing exposure apparatus, repeated patterns are provided preparatorily on an object with respect to which the position detection is to be made and wherein these patterns are detected photoelectrically to complete the position detection.

SUMMARY OF THE INVENTION

It has been found that where repeated patterns constituting a mark have a regular interval, there is a high possibility of occurrence of an error in the detection of the mark when light is projected upon the mark and an image thereof formed by the reflected light therefrom is received by an image sensor such that the formed image is digitalized (quantized) by the picture elements or pixels of the image sensor. Details of this will now be explained with reference to FIG. 4.

Denoted at 30 in part (a) of FIG. 4 is a mark signal corresponding to the image of a mark as formed on an image sensor by the light reflected from the mark. Longitudinal fine lines 40 having a regular pitch depict the pitch of sampling of the mark image by the constituent elements of the image sensor. The interval or pitch of lines 40 is denoted at Pix. Thus, a unit Pix may be considered as corresponding to one picture element for sampling. In part (a) of FIG. 4, two patterns which are constituent members of a mark are positioned with exact alignment with boundaries of the sampling picture elements. Thus, hatched zones 31 and 32 can be correctly discriminated electrically as being patterns. What is to be detected finally is the position of the center of these left and right patterns. Therefore, with regard to the left-hand pattern, a used mark position detecting device operates to determine the center 33 of the hatched portion 31 having been electrically discriminated as a pattern. Similarly, with regard to the right-hand pattern, the center 34 of the hatched portion 32 is determined. Then, the position of the center 35 of the thus determined positions 33 and 34 is determined as the position of the center 36 of the mark. In the case of part (a) of FIG. 4, the mark image rests on the sampling picture elements without any eccentricity. As a result, the detected position 35 exactly coincides with a true mark center 36.

If, on the other hand, the formed mark image has eccentricity with the picture elements such as illustrated in part (b) of FIG. 4 (i.e. in a case where the mark image is shifted leftwardly from the part (a) state by ¼ Pix), the used mark position detecting device electrically discriminates hatched portions 31 and 32 as being patterns. Since the actual patterns are slightly deviated from boundaries of the sampling picture elements, the positions of the midst of the left and right patterns are determined by calculation to be at 33 and 34, respectively. Additionally, the position 35 which is at the center between the positions 33 and 34 is determined as the center of the mark. This is slightly deviated from the true mark center position 36. Namely, in spite of the fact that the mark is shifted actually by ¼ Pix as compared with the state shown in part (a), the result of measurement shows a deviation of ½ Pix.

Further, if as shown in part (c) of FIG. 4 the mark image is shifted on the picture elements by ½ Pix from the state shown in part (a), the correct position can be detected.

As described, despite the fact that high-precision position detection is required in the field of semiconductor device manufacturing exposure apparatuses or otherwise, there still remains a possibility of occurrence of an error at the stage of digitalization. In the described example, a minute deviation of an amount not greater than ½ Pix is not detectable.

It is accordingly a primary object of the present invention to provide a mark position detecting method which can meet the requirement of high-precision mark position detection as described and which easily assures high-precision mark position detection with a simple structure.

In accordance with one aspect of the present invention, there can be provided a mark position detecting method and device in which a mark having repeated patterns is preparatorily provided on an object, wherein at least one pattern repetition pitch of the mark is set to be different from another pattern repetition pitch. Light is projected upon such a mark and, on the basis of output signals from constituent elements (picture elements) of an image sensor which receives a mark image formed by the light reflected from the mark, the position of the mark is calculated correctly.

In accordance with another aspect of the present invention, there can be provided a mark position detecting device and method, in which a mark is formed by repeated patterns of a number N (N is an integral number not less than 2) and in which the repeated patterns are so set that at least one pitch Pp of the repeated patterns of the number N satisfies, on a light-receiving surface of an image sensor, the following relationship:

$$Pp = (m + n/N) \times Pix$$

wherein m is an arbitrary integral number and n is an integral number which satisfies $1 \leq n \leq N$.

In other words, the repetition of patterns is so set that at least one pattern repetition pitch of the mark differs from a multiple, by an integral number, of the sampling pitch of the image sensor.

With this arrangement, at least one pitch of patterns forming a mark whose position is to be detected, is made different from another. As a result, any error caused upon quantization by the picture elements of an image sensor can be canceled or compensated at the time of calculation of the center of the mark, whereby the measurement precision can be improved.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a schematic view explicating the inconveniences peculiar to the mark position detection according to a known type detecting method.

FIG. 5 is a schematic view for explicating the principle of mark position detection according to the FIG. 1 embodiment.

DESCRIPTION OF THE PREFERRED EMBODIMENTS

Figure 1:
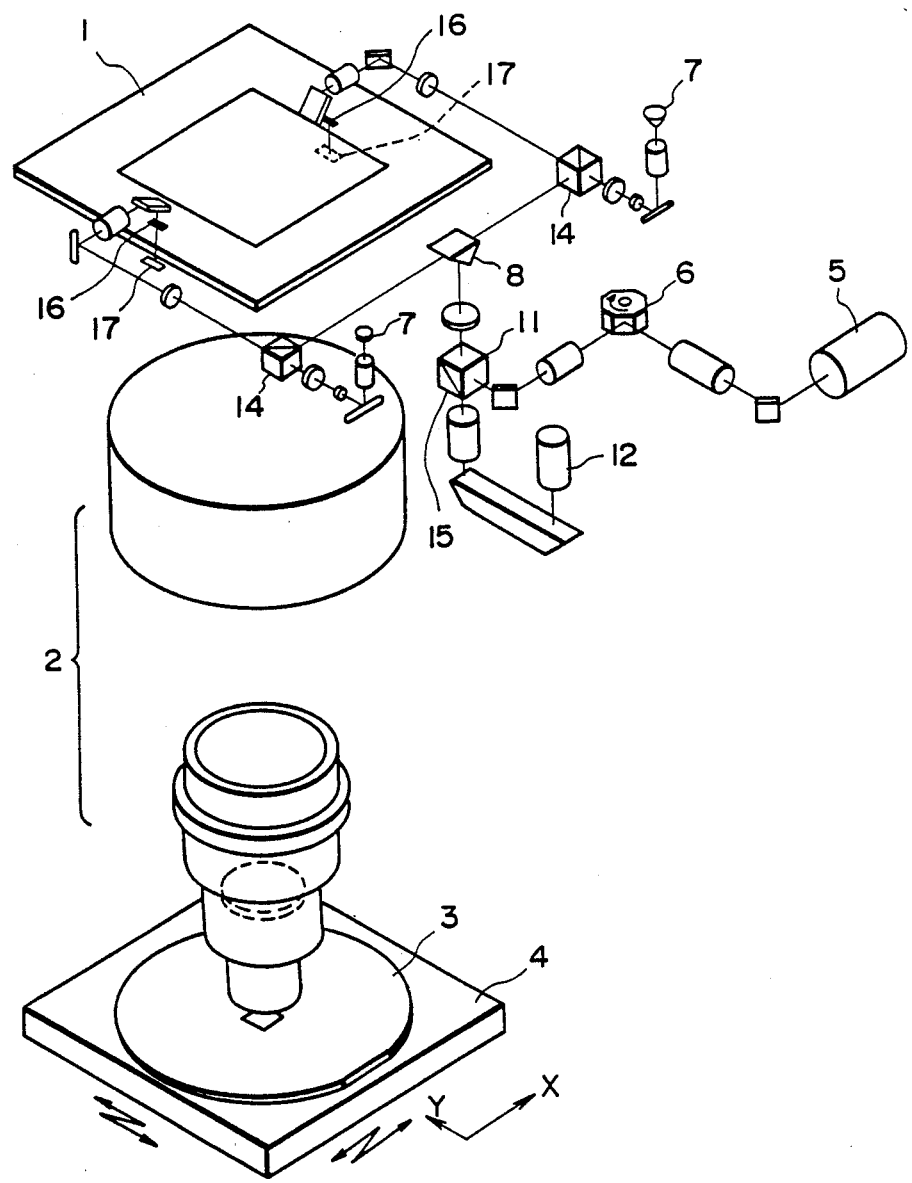
FIG. 1 is a schematic view showing an optical arrangement of a mark position detecting device according to an embodiment of the present invention, wherein the invention is applied to align a reticle in a semiconductor device manufacturing exposure apparatus.

Referring first to FIG. 1, there is schematically shown an optical arrangement, in an occasion where a mark detecting method and apparatus according to an embodiment of the present invention is applied to the alignment of a reticle in a semiconductor device manufacturing exposure apparatus, e.g., a stepper.

In FIG. 1, a laser beam as produced by a laser producing device 5 goes to a polygonal mirror 6 by way of a mirror and a lens. The polygonal mirror 6 is rotatable at a predetermined angular speed, such that the laser beam is scanningly deflected thereby. The scanning laser beam being deflected by the polygonal mirror 6 is reflected by a beam splitter 11 and then is divided by a roof prism 8 into two beams which advance along two, left and right paths. Each of the split scanning laser beams is reflected by a beam splitter 14 and, after passing through or being reflected by an objective lens, an objective mirror, etc., it impinges upon a reticle alignment mark 16 provided on a reticle 1, whereby it is scanned by the laser beam. Further, the light passing through the reticle 1 impinges on and scans a reticle setting mark 17 which is fixedly provided on a stationary portion of the exposure apparatus such as a barrel of a projection lens system 2, for example.

The lights reflected from the left and right reticle alignment marks 16 and the left and right reticle setting marks 17 go backwardly along their oncoming paths and enter into the beam splitters 14. After passing the beam splitters, the lights are received by photodetectors (photodiodes) 7. At the same time, portions of the lights from these reticle alignment marks 16 and reticle setting marks 17 are reflected by the beam splitters 14 and, after being deflected by the roof prism 8, they enter into and pass through the beam splitter 11. Finally, they pass through a lens 15 as well as an elongated prism and are received by a CCD camera 12, such that images of the marks 16 and 17 are formed upon an image pickup surface of the camera 12.

It will be readily understood from the foregoing that the images of the reticle alignment marks 16 provided on the reticle 1 and the reticle setting marks 17 fixedly provided on the stationary portion (e.g. lens barrel) of the exposure apparatus can be taken by the CCD camera 12 as imagewise information in which left-hand and right-hand mark images are combined. Further, the intensity of the reflected light from a mark upon irradiation of the same with the scanning laser beam can be detected by the photodetector 7.

In FIG. 1, reference numeral 3 denotes a semiconductor wafer on which a plurality of shot areas corresponding to semiconductor chips are defined. Reference numeral 4 denotes an X—Y stage on which the wafer 3 is placed and which is movable stepwise in each of X and Y directions during printing of a pattern of the reticle 1 upon each shot area of the wafer 3 in a step-and-repeat manner, by use of the projection lens system 2.

Figure 2:
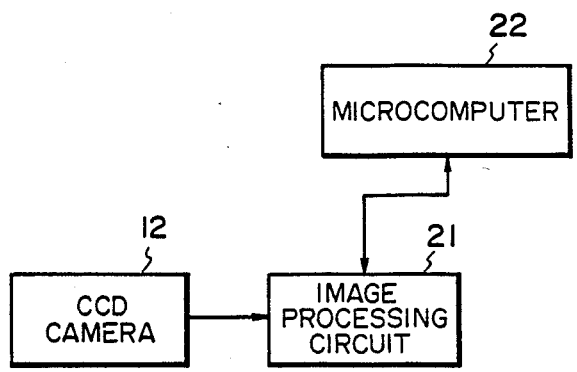
FIG. 2 is a block diagram of a portion of the exposure apparatus of the FIG. 2 example, which portion plays the role of image processing, for example.

FIG. 2 is a block diagram of a portion of the exposure apparatus of the present embodiment, which portion functions to execute the image processing, for example.

In FIG. 2, denoted at 21 is an image processing circuit which, in response to reception of an image signal from the CCD camera 12, executes calculation of any positional deviation of a mark, for example. Denoted at 22 is a microcomputer adapted to control the apparatus as a whole.

Figure 3:
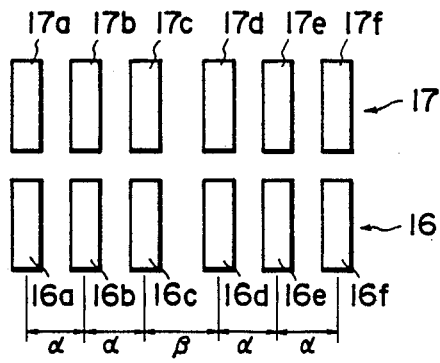
FIG. 3 is a schematic view which exemplifies a reticle setting mark and a reticle alignment mark.

FIG. 3 shows an example of a configuration of a reticle setting mark 17 and a reticle alignment mark 16 usable in this embodiment.

In this example, the mark 16 is provided by repeated patterns 16a-16f, while the mark 17 is provided by similar repeated patterns 17a-17f. As illustrated, these patterns are formed with different pitches. More specifically, of the pitches, the middle pitch $\beta$ between the patterns 16c and 16d (17c and 17d) is made different from the other pitches $\alpha$. The detecting device is operable to determine, with regard to the reticle setting mark 17, the center of the group of the patterns 17a-17f constituting the mark 17. Similarly, with regard to the reticle alignment mark 16, the device is operable to determine the center of the group of the patterns 16a-16f. By detecting any positional deviation between the thus determined centers, the relative positional relationship between these marks, namely, the relative positional relationship between the reticle 1 and a stationary portion of the exposure apparatus (e.g. projection lens system 2) is determined.

Referring now to FIG. 5, how the precision of the mark position detection is improved with the device of the present embodiment will be explained.

In this embodiment, the width of each pattern (e.g. 16a) of the mark image as formed on the image pickup surface of the CCD camera 12 is set to be equal to a multiple, by an integral number, of the sampling pitch (pitch of the picture elements of the image sensor 12) Pix and, in addition thereto, one ($\beta$ in FIG. 3) of the pitches of the patterns (each may be equal to the interval of the centers of adjacent patterns) is set to be equal to the sum of a multiple, by an integral number, of the sampling pitch Pix with a value corresponding to $\frac{1}{2}$ Pix.

Where these pitches are set, the mark position detection may be made in the following manner:

In the case of part (a) of FIG. 5, patterns on both sides rest on the image sensor without eccentricity with respect to the boundaries of the sampling picture elements. As a result, hatched portions 31 and 32 are electrically discriminated as being the patterns. What is to be finally detected is the position of the center between the left and right patterns. For this reason, the mark position detecting device first operates, in relation to the left-hand pattern, to determine the center 33 of the hatched portion 31 having been discriminated as a pattern. With regard to the right-hand pattern, similarly the center 34 of the hatched portion 32 is determined. Then, the position 35 of the center between the positions 33 and 34 is determined as the center of the mark. As illustrated, the thus determined position 35 is exactly coincident with a true mark center position 36.

Part (b) of FIG. 5 illustrates a case where the mark is shifted leftwardly from the part (a) state by ¼ Pix, while part (c) illustrates a case where the mark is further shifted leftwardly from the part (b) state by ¼ Pix. It is seen from FIG. 5 that in any case the true mark center position can be detected without an error. That is, in this example, the mark position can be detected with an accuracy of ¼ Pix. In comparison with the conventional example of FIG. 4, parts (a)–(c), wherein the highest measurement precision is ½ Pix, it is seen that the measurement precision is improved remarkably.

Figure 6:
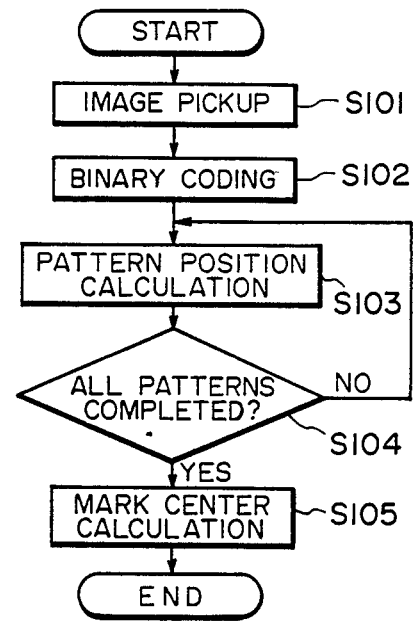
FIG. 6 is a flow chart for explicating the manner of mark position detection in the present embodiment.

Next, referring to the flow chart of FIG. 6, the operation of the present embodiment will be explained in more detail.

First, upon start of the procedure, image pickup is made by the CCD camera 12 by use of the optical system shown in FIG. 1 (step S101). Subsequently, at step S102, the introduced imagewise data is binary-coded, the coding being made for each signal from a corresponding picture element. This operation corresponds to the process by which, as has been described with reference to FIG. 5, the hatched portions 31 and 32 shown in this Figure are determined. At step S103, the position of each of the patterns constituting a mark is calculated. This corresponds to the determination of the center positions 33 and 34 of the patterns in the FIG. 5 case. Subsequently, at step S104, discrimination is made as to whether the position calculation has been completed with regard to all the patterns. If not completed, the sequence goes back to step S103 and the position calculation is repeated. If the calculation for all the patterns is completed, the sequence goes to step S105 whereat the position of the center of the mark is calculated by using the positional data concerning the patterns. This process corresponds to the calculation of the mark center position 35 in the FIG. 5 example. By the above-described procedure, the position of the center of the mark is calculated.

Figure 7:
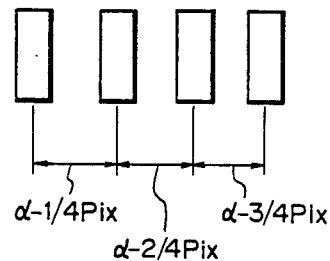
FIG. 7 is a schematic view of a mark formed in accordance with another aspect of the present invention.

While in the foregoing embodiment a pitch between two adjacent patterns is set to be equal to the sum of a multiple, by an integral number, of the sampling pitch with a value corresponding to ½ pitch (Pix) thereby to assure measurement precision of ¼ Pix, the present invention is not limited to this. For example, as illustrated in FIG. 7, a mark may be provided by four patterns 41a–41d with all different pitches, namely:

α—¼ Pix, α—2/4 Pix, and α—3/4 Pix

With this structure, a high measuring precision up to ⅛ Pix is attainable. Generally, the following relationship such as shown in Table 1 is attainable between the mark pattern pitch and obtainable resolution.

TABLE 1

| NO. OF PATTERNS | PITCH | RESOLUTION |
|---|---|---|
| 2 | (N* + ½) Pix | ¼ Pix |
| 3 | (N + ⅓) Pix | 1/6 Pix |
|   | (N + ⅔) Pix |   |
| 4 | (N + ¼) Pix | ⅛ Pix |
|   | (N + 2/4) Pix |   |
|   | (N + ¾) Pix |   |
| 5 | (N + 1/5) Pix | 1/10 Pix |
|   | (N + 2/5) Pix |   |
|   | (N + 3/5) Pix |   |
|   | (N + 4/5) Pix |   |

TABLE 1-continued

| NO. OF PATTERNS | PITCH | RESOLUTION |
|---|---|---|
| AND SO FORTH | | |

*N is an integral number

Further, while the foregoing description has been made to a case where the mark detecting method and device of the present invention is applied to the alignment of a reticle in a semiconductor device manufacturing exposure apparatus, the concept of the present invention is of course applicable to the alignment of a wafer.

It is added that the word "pattern" used in this Specification means one defined by a surface protrusion or recessed portion where the pattern is defined by a surface step. Also, it means one of a bright portion and a dark portion where the pattern is defined by contrast between bright and dark areas.

In accordance with the present invention, as described hereinbefore, repeated patterns of a mark whose position is to be detected have different pitches and, with this arrangement, the measuring precision with regard to the detection of the mark position can be improved remarkably.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting position of a mark, comprising the steps of:
    irradiating, with light from a light source, a mark formed on an object and being provided by repeated patterns;
    forming an image of the mark on an image pickup surface of an image sensor, by use of light from the object;
    photoelectrically converting the image of the mark with a predetermined sampling pitch defined by the image sensor; and
    calculating the position of the mark on the basis of a signal from the image sensor produced as a result of the photoelectric conversion;
    wherein at least one pitch Pp of the repeated patterns satisfies on the image pickup surface of the image sensor the following relationship $$Pp = (m + n/N) \times Pix$$

where N is an integral number not less than 2 and corresponds to the number of the patterns, m is an arbitrary number, n is an integral number that satisfies $1 \leq n < N$, and Pix is the sampling pitch of the image sensor.

2. A method according to claim 1, wherein the width of each pattern as measured on the image pickup surface of the image sensor is substantially equal to the sampling pitch of the image sensor.

3. A method of detecting position of a mark, comprising the steps of:
    irradiating, with light from a light source, a mark formed on an object and being provided by repeated patterns;
    forming an image of the mark on an image pickup surface of an image sensor, by use of light from the object;

photoelectrically converting the image of the mark with a predetermined sampling pitch as defined by the image sensor; and calculating the position of the mark on the basis of a signal from the image sensor produced as a result of the photoelectric conversion;

wherein at least one pitch of the repeated patterns, upon the image pickup surface of the image sensor, is not equal to a multiple, by an integral number, of the sampling pitch of the image sensor.

4. A method according to claim 3, wherein the width of each pattern as measured on the image pickup surface of the image sensor is substantially equal to the sampling pitch of the image sensor.

5. A method of detecting position of a mark, comprising the steps of:

irradiating, with light from a light source, a mark formed on an object and being provided by repeated patterns;

forming an image of the mark on an image pickup surface of an image sensor, by use of light from the object;

photoelectrically converting the image of the mark with a predetermined sampling pitch defined by the image sensor; and calculating the position of the mark on the basis of a signal from the image sensor produced as a result of the photoelectric conversion;

wherein at least one pitch of the repeated patterns differs from another pitch and wherein the difference in these pitches of the repeated patterns is, on the image pickup surface of the image sensor, equal to a half of the sampling pitch of the image sensor.

6. A method according to claim 5, wherein the width of each pattern as measured on the image pickup surface of the image sensor is substantially equal to the sampling pitch of the image sensor.

7. A reticle for use in a semiconductor exposure apparatus, comprising:

a base member;

a pattern formed on said base member, to be printed on a semiconductor wafer by exposure; and a mark provided on said base member and being adapted to be observed by an image sensor, for positioning of said reticle with respect to a predetermined position, said mark having patterns of a number N which is an integral number not less than 2, wherein at least one pitch Pp of the patterns satisfies on an image pickup surface of the image sensor the following relationship $$Pp = (m + n/N) \times Pix$$

where m is an arbitrary number, n is an integral number that satisfies $1 \leq n < N$ and Pix is the sampling pitch of the image sensor.

8. A reticle according to claim 7, wherein the width of each pattern as measured on the image pickup surface of the image sensor is substantially equal to the sampling pitch of the image sensor.

* * * * *

UNITED STATES PATENT AND TRADEMARK OFFICE
CERTIFICATE OF CORRECTION

PATENT NO. : 4,933,715
DATED : June 12, 1990
INVENTOR(S) : YUICHI YAMADA ET AL.

It is certified that error appears in the above-identified patent and that said Letters Patent is hereby corrected as shown below:

COLUMN 3

Line 5, "FIG. 2 example," should read --FIG. 1 example,--.

COLUMN 6

Line 55, "$1 \leq n < N$," should read --$1 \leq n \leq N$,--.

COLUMN 8

Line 24, "$1 \leq n < N$" should read --$1 \leq n \leq N$--.

Signed and Sealed this

Twenty-second Day of October, 1991

Attest:

HARRY F. MANBECK, JR.

Attesting Officer        Commissioner of Patents and Trademarks